(12) United States Patent
An et al.

(10) Patent No.: US 12,114,443 B2
(45) Date of Patent: Oct. 8, 2024

(54) ELECTRONIC DEVICE

(71) Applicant: VIVO MOBILE COMMUNICATION CO., LTD., Guangdong (CN)

(72) Inventors: Kangyan An, Guangdong (CN); Yun Chen, Guangdong (CN); Huasheng Zhu, Guangdong (CN); Mo Zhou, Guangdong (CN); Haibo Que, Guangdong (CN); Hongchao Zhao, Guangdong (CN); Fei Cao, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 197 days.

(21) Appl. No.: 17/991,556

(22) Filed: Nov. 21, 2022

(65) Prior Publication Data

US 2023/0096954 A1    Mar. 30, 2023

Related U.S. Application Data

(63) Continuation of application No. PCT/CN2021/095942, filed on May 26, 2021.

(30) Foreign Application Priority Data

May 29, 2020 (CN) .......................... 202010479607.8

(51) Int. Cl.
*H05K 5/02* (2006.01)
(52) U.S. Cl.
CPC .................................. *H05K 5/0217* (2013.01)
(58) Field of Classification Search
CPC ..................................................... H05K 5/0217
See application file for complete search history.

(56) References Cited

U.S. PATENT DOCUMENTS

| 8,711,566 B2 | 4/2014 | O'Brien |
| 10,582,629 B2 | 3/2020 | Su et al. |

(Continued)

FOREIGN PATENT DOCUMENTS

| CN | 105518769 A | 4/2016 |
| CN | 105676962 A | 6/2016 |

(Continued)

OTHER PUBLICATIONS

European Patent Office "Extended European Search Report" From Application No. 21813292.6, Dated Oct. 26, 2023, pp. 1-10.

(Continued)

*Primary Examiner* — Jerry Wu
(74) *Attorney, Agent, or Firm* — Fredrikson & Byron, P.A.

(57) ABSTRACT

This invention discloses an electronic device, including a first housing; a second housing, where the second housing is slidably connected to the first housing; a first elastic piece, where a first end of the first elastic piece is connected to the second housing; a flexible display screen, where a first end of the flexible display screen is connected to a second end of the first elastic piece, a second end of the flexible display screen is connected to the first housing, and the first housing can drive the second end of the flexible display screen to move; a rotating shaft, where the rotating shaft is rotatably disposed in the second housing, the flexible display screen is in rolling contact with the rotating shaft, and the first housing can drive the flexible display screen to move around the rotating shaft.

8 Claims, 6 Drawing Sheets

(56) References Cited

U.S. PATENT DOCUMENTS

| | | | | |
|---|---|---|---|---|
| 11,042,195 B1* | 6/2021 | Hong | ................. | H04M 1/0268 |
| 2018/0176352 A1 | 6/2018 | Shin et al. | | |
| 2018/0188778 A1 | 7/2018 | Shin | | |
| 2019/0141849 A1 | 5/2019 | Su et al. | | |
| 2019/0305237 A1* | 10/2019 | Shin | ....................... | H10K 59/12 |
| 2020/0159291 A1 | 5/2020 | Dong | | |

FOREIGN PATENT DOCUMENTS

| | | | |
|---|---|---|---|
| CN | 205910897 U | 1/2017 | |
| CN | 106788536 A | 5/2017 | |
| CN | 206270800 U | 6/2017 | |
| CN | 107424518 A | 12/2017 | |
| CN | 108196718 A | 6/2018 | |
| CN | 108259649 A | 7/2018 | |
| CN | 109819074 A | 5/2019 | |
| CN | 209267628 U | 8/2019 | |
| CN | 209728581 U | 12/2019 | |
| CN | 110706598 A | 1/2020 | |
| CN | 110706600 A | 1/2020 | |
| CN | 110992833 A | 4/2020 | |
| IN | 206657595 U | 11/2017 | |
| JP | 2003319042 A | 11/2003 | |
| JP | 2012134971 A | 7/2012 | |
| JP | 2014531796 A | 11/2014 | |
| KR | 1020050061870 A | 6/2005 | |
| KR | 1020190062855 A | 6/2019 | |
| KR | 102111376 B1 | 5/2020 | |

OTHER PUBLICATIONS

International Patent Application No. PCT/CN2021/095942, International Search Report and Written Opinion with Partial English Machine Translation mailed Sep. 1, 2021, 10 pages.

* cited by examiner

ELECTRONIC DEVICE

CROSS-REFERENCE TO RELATED APPLICATIONS

This application is a continuation of International Application No. PCT/CN2021/095942, filed on May 26, 2021, which claims priority to Chinese Patent Application No. 202010479607.8, filed with the Chinese Patent Office on May 29, 2020 and entitled "ELECTRONIC DEVICE", which is incorporated herein by reference in its entirety.

TECHNICAL FIELD

The present disclosure relates to the technical field of communications devices, and in particular, to an electronic device.

BACKGROUND

With the rapid development of electronic devices, the electronic devices are applied increasingly widely, for example, mobile phones, tablet computers, and the like play a growing number of roles in people's work, life, entertainment, and the like.

Currently, increasing sizes of display screens of electronic devices can make electronic devices have a better visual effect, so as to meet needs of users. However, larger display screens of electronic devices bring about problems such as inconvenient carrying. Therefore, a concept of stretchable screen electronic devices gradually become popular. Alternatively, in a stretchable screen electronic device, a display screen of the electronic device may be connected to a rotating shaft in a rolling manner. When the display screen is retracted, the display screen may be rolled on the rotating shaft, so that a size of the electronic device is smaller, thereby making it convenient for users to carry. When the display screen is pulled out, the size of the display screen becomes larger, thereby providing better visual experience.

However, when the display screen is fully retracted, most parts of the display screen is rolled on the rotating shaft. This is easy to damage the display screen, thereby affecting user experience.

SUMMARY

The present disclosure is implemented as follows.

An electronic device is provided, which includes: a first housing: a second housing, where the second housing is slidably connected to the first housing: a first elastic piece, where a first end of the first elastic piece is connected to the second housing: a flexible display screen, where a first end of the flexible display screen is connected to a second end of the first elastic piece, a second end of the flexible display screen is connected to the first housing, and the first housing can drive the second end of the flexible display screen to move: a rotating shaft, where the rotating shaft is rotatably disposed in the second housing, and the flexible display screen is in rolling contact with the rotating shaft. In a case that the first housing slides in a direction far from the second housing, the first housing drives the flexible display screen to move around the rotating shaft, and a part of the flexible display screen moves from a first side to a second side. In a case that the first housing slides in a direction close to the second housing, the first elastic piece drives the flexible display screen to move around the rotating shaft, and the part of the flexible display screen moves from the second side to the first side. The first side and the second side are two sides of the rotating shaft that are opposite each other.

BRIEF DESCRIPTION OF DRAWINGS

To describe the technical solutions in the embodiments of the present disclosure or in the background art more clearly, the drawings required for describing the embodiments or the background art are described briefly below: Obviously, other drawings can be obtained by those of ordinary skill in the art based on these drawings without creative efforts.

Figure 1:
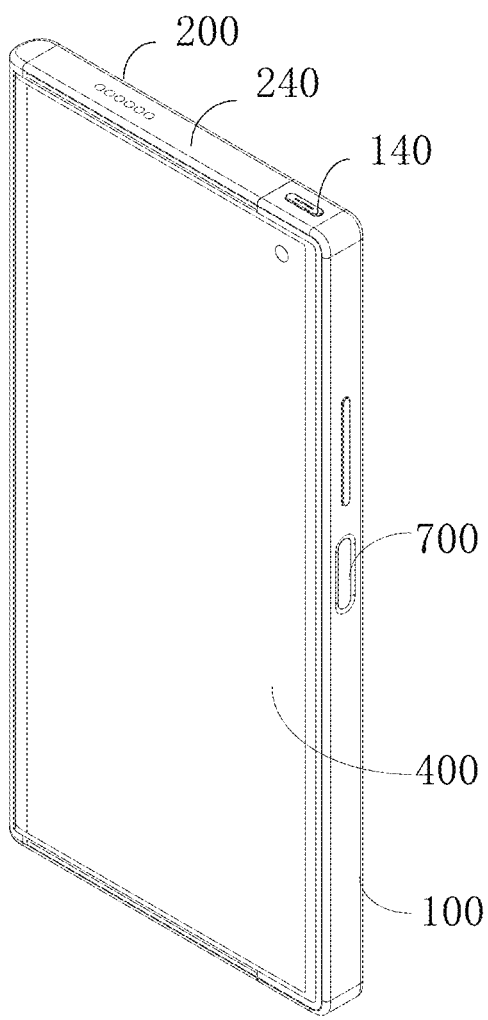
FIG. 1 is a schematic structural diagram of an electronic device according to an embodiment of the present disclosure.
Figure 2:
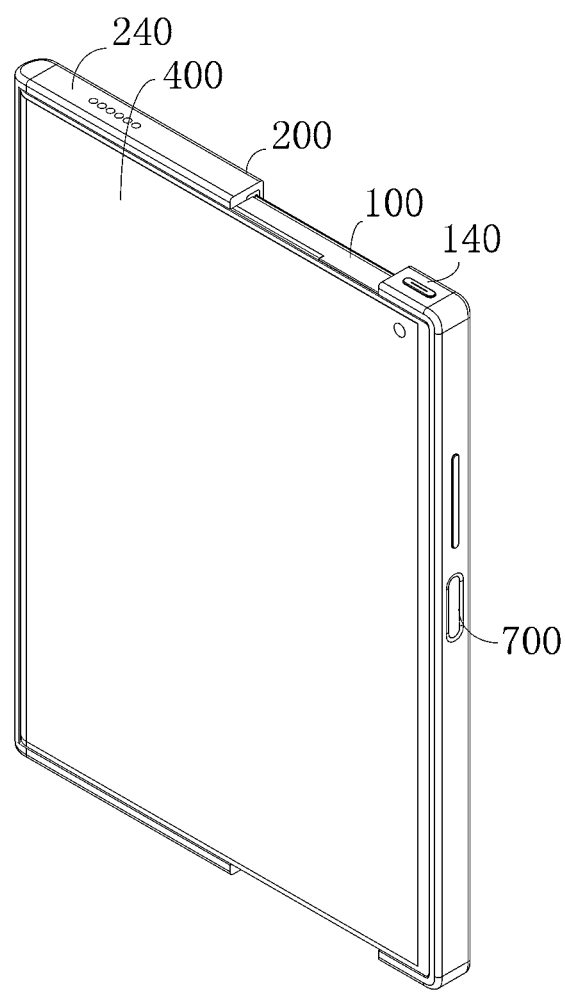
FIG. 2 is a schematic structural diagram of an electronic device in another state according to an embodiment of the present disclosure.
Figure 3:
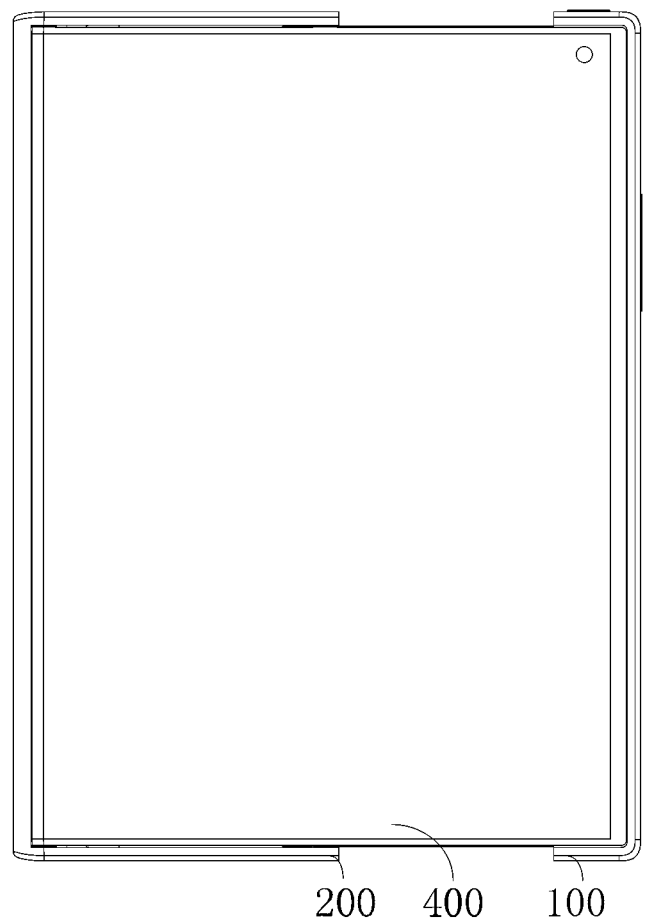
FIG. 3, FIG. 4, and FIG. 5 are structural schematic diagrams of an electronic device under different viewing angles according to an embodiment of the present disclosure.
Figure 4:
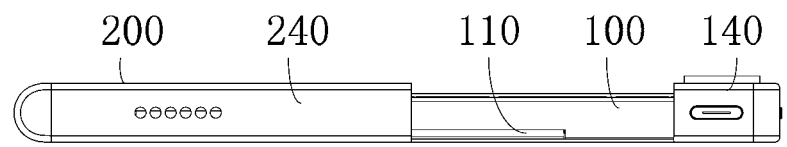
Figure 5:
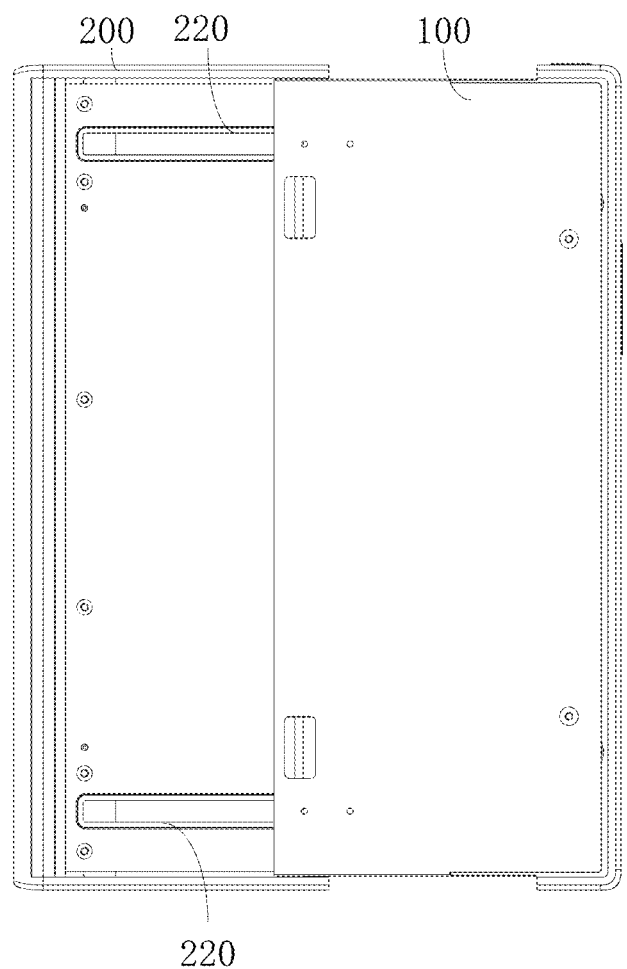

Reference numerals in the accompanying drawings are as follows:

- 100. first housing: 110. first connecting portion: 120. limiting sliding block: 130. first mounting portion: 131. first guide slope: 140. first middle frame;
- 200. second housing: 210. second connecting portion: 220. limiting groove: 230. second mounting portion: 231. second guide slope: 240. second middle frame;
- 300. first elastic piece;
- 400. flexible display screen;
- 500. rotating shaft;
- 600. damper;
- 700. key;
- 810. second elastic piece; and 820. hinged shaft.

DESCRIPTION OF EMBODIMENTS

To make the objects, technical solutions, and advantages of the present disclosure clearer, the following clearly describes the technical solutions of the present disclosure with reference to specific embodiments of the present disclosure and corresponding accompanying drawings. Apparently, the described embodiments are merely some rather than all of the embodiments of the present disclosure. Based on the embodiments of the present disclosure, all other embodiments obtained by a person of ordinary skill in the art without creative efforts fall within the protection scope of the present disclosure.

The technical solutions disclosed by the embodiments of the present disclosure are described in detail below with reference to the accompanying drawings.

As shown in FIG. 1 to FIG. 10, an embodiment of the present disclosure discloses an electronic device. The disclosed electronic device includes a first housing 100, a second housing 200, a first elastic piece 300, and a flexible display screen 400.

The first housing 100 and the second housing 200 are peripheral components of the electronic device. The first housing 100 and the second housing 200 can provide an installation position for other components of the electronic device. In this embodiment of the present disclosure, the second housing 200 may be slidably connected to the first housing 100. In this case, the first housing 100 can slide relative to the second housing 200, so that the first housing 100 and the second housing 200 can be in a detached or connected state.

The first elastic piece 300 may be disposed in the second housing 200. Alternatively, a first end of the first elastic piece 300 is connected to the second housing 200, and a second end of the first elastic element 300 is connected to the flexible display screen 400. The first elastic piece 300 can provide an elastic force for the flexible display screen 400, so that the flexible display screen 400 is in a tensioned and unfolded state. Optionally, the first elastic piece 300 can be a spiral spring. The spiral spring has a simple structure and is convenient for assembly. Certainly, the first elastic piece 300 may also be other elastic components, which is not limited in this embodiment of the present disclosure.

The flexible display screen 400 is a display screen that is elastically deformable. In this embodiment of the present disclosure, a first end of the flexible display screen 400 is connected to the second end of the first elastic piece 300, a second end of the flexible display screen 400 is connected to the first housing 100, and the first housing 100 can drive the second end of the flexible display screen 400 to move. During use, the first housing 100 can drive at least a part of the flexible display screen 400 to expand onto the first housing 100 and the second housing 200, so that a display area of the flexible display screen 400 exposed to the external environment can be increased, so that the electronic device has better visual experience.

The rotating shaft 500 is rotatably disposed in the second housing 200, and the flexible display screen 400 is in rolling contact with the rotating shaft 500. The rotating shaft 500 can position the flexible display screen 400, and also change a moving direction of the flexible display screen 400.

For example, in a case that the first housing 100 slides in a direction away from the second housing 200, the first housing 100 drives the flexible display screen 400 to move around the rotating shaft 500, and a part of the flexible display screen 400 move from a first side to a second side, so that more parts of the flexible display screen 400 can be displayed on an overall outer surface formed by the first housing 100 and the second housing 200, so that the display area of the flexible display screen 400 exposed to the external environment can be increased, thereby being better presented to the users. In a case that the first housing 100 slides in a direction close to the second housing 200, the first elastic piece 300 drives the flexible display screen 400 to move around the rotating shaft 500, and the part of the flexible display screen 400 moves from the second side to the first side, so that the part of the exposed area of the flexible display screen 400 is transferred to the first side, so that the flexible display boundary 400 can reduce the display area exposed to the external environment. The first side and the second side are two sides of the rotating shaft 500 that are opposite each other.

In addition, because the first end of the flexible display screen 400 is connected to the second end of the first elastic piece 300, the first elastic piece 300 can generate a pulling force on the flexible display screen 400 to keep the flexible display screen 400 on the second side in an unfolded state, thereby preventing damages on the flexible display screen 400 due to wrinkles.

It can be seen from the above that in the electronic device disclosed in this embodiment of the present disclosure, the first housing 100 can drive the flexible display screen 400 to move, so that a display area of the flexible display screen 400 exposed to the external environment can be increased, thereby providing users with a better visual effect. In addition, after use, the part of the flexible display screen 400 moves from the second side to the first side, so that the flexible display screen 400 can be folded, and under a pull force generated by the first elastic piece 300, the part of the flexible display screen 400 can always be in an unfolded state on the first side, thereby preventing the part of the flexible display screen 400 from being damaged due to wrinkles.

Further, the electronic device disclosed in this embodiment of the present disclosure may further include a damper 600. The first end of the first elastic piece 300 may be connected to the second housing 200 through the damper 600. The damper 600 can reduce energy generated due to oscillation of the first elastic piece 300, so as to play the role of damping and energy dissipation. During an operation process, the damper 600 can prevent the first elastic piece 300 from generating an excessive pulling force on the flexible display screen 400, so that the first elastic piece 300 can pull the flexible display screen 400 more smoothly, and the part of the flexible display screen 400 can expand to the first side more stably.

Optionally, to make the part of the flexible display screen 400 expand to the first side more smoothly, a quantity of the first elastic piece 300 may be two, and the two first elastic pieces 300 may be symmetrically disposed relative to the flexible display screen 400. During use, the two first elastic pieces 300 can pull the flexible display screen 400 in two directions, so that the part of the flexible display screen 400 can expand to the first side more smoothly. In addition, each first elastic piece 300 may be connected to the second housing 200 through the damper 600, so that the first elastic piece 300 can pull the flexible display screen 400 more stably.

In this embodiment of the present disclosure, an edge of the first housing 100 may be provided with a first connecting portion 110, and an edge of the second housing 200 may be provided with a second connecting portion 210. At least part of the second housing 200 fits around the first housing 100, and the first connecting portion 110 may be slidably connected to the second connecting portion 210. In this case, the first housing 100 may be slidably connected to the second housing 200 through the first connecting portion 110 and the second connecting portion 210 to facilitate the assembly of the first housing 100 and the second housing 200. In addition, at least part of the second housing 200 fits around the first housing 100 to make a structure of the electronic device more compact. Another component of the electronic device may be disposed in the second housing 200. The first housing 100 may be only a back cover of the electronic device to facilitate an overall layout of the electronic device.

Certainly, to prevent the first housing 100 and the second housing 200 from being stuck, edges of two opposite sides of the first housing 100 are provided with the first connecting portion 110. Correspondingly, edges of two opposite sides of the second housing 200 are provided with the second connecting portion 210. The first housing 100 may be slidably connected to the second housing 200 through a fit between the first connecting portion 110 and the second connecting portion 210. This method can play a better guiding role, so that the first housing 100 can slide better relative to the second housing 200, thereby preventing the first housing 100 and the second housing 200 from being stuck.

Optionally, one of the first connecting portion 110 and the second connecting portion 210 may be a sliding groove, and the other one may be a protrusion. The sliding groove may be in sliding fit with the protrusion. In this case, the first housing 100 may be slidably connected to the second housing 200 through the sliding fit between the sliding groove and the protrusion. The sliding groove and the protrusion can play a guiding role, so that the first housing 100 can slide better relative to the second housing 200, and the first housing 100 can better drive the flexible display screen 400 to expand or fold.

In this embodiment of the present disclosure, one of the first housing 100 and the second housing 200 may be provided with a limiting groove 220, and the other one may be provided with a limiting sliding block 120. The limiting groove 220 may be in sliding fit with a limiting sliding block 120, and an end portion of the limiting groove 220 may be in limiting fit with the limiting sliding block 120. In this case, the first housing 100 may be slidably connected to the second housing 200 through the sliding fit between the limiting sliding block 120 and the limiting groove 220. The limiting groove 220 and the limiting sliding 120 can play a guiding function, so that the first housing 100 can slide better relative to the second housing 200. In addition, the limiting fit between the end portion of the limiting groove 220 and the limiting sliding block 120 can also prevent the first housing 100 from separating from the second housing 200, thereby improving sliding stability of the first housing 100.

Figure 6:
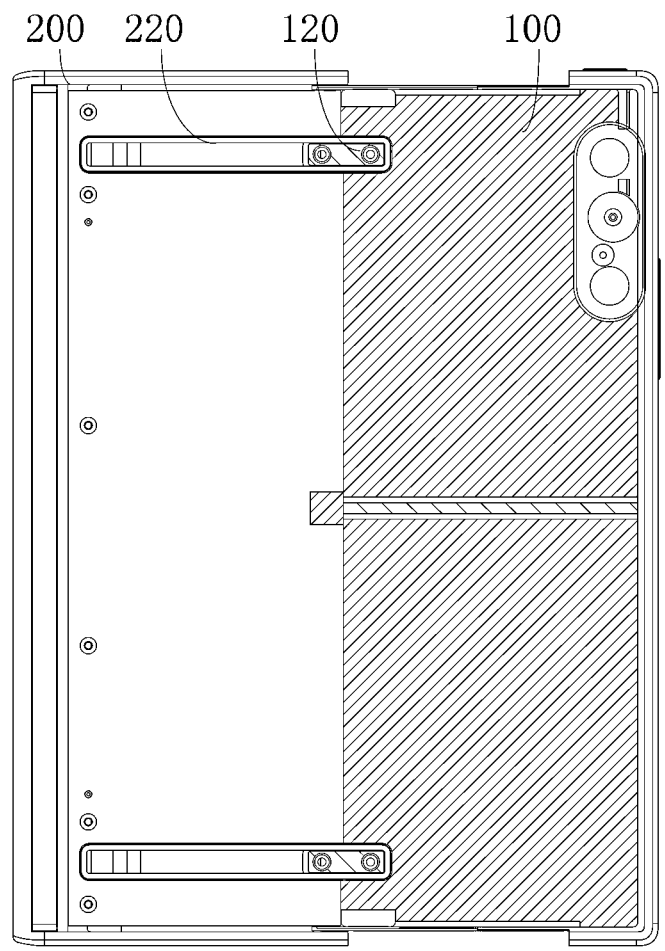
FIG. 6 is a cross-sectional view of an electronic device according to an embodiment of the present disclosure.
Figure 7:
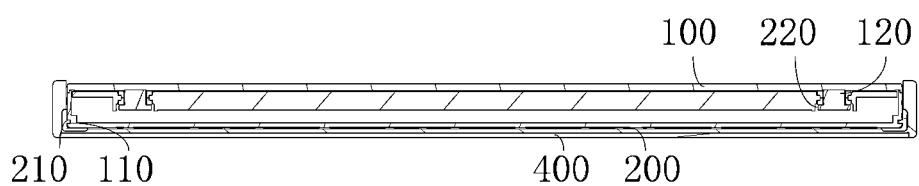
FIG. 7 is a partial cross-sectional view of an electronic device according to an embodiment of the present disclosure.
Figure 8:
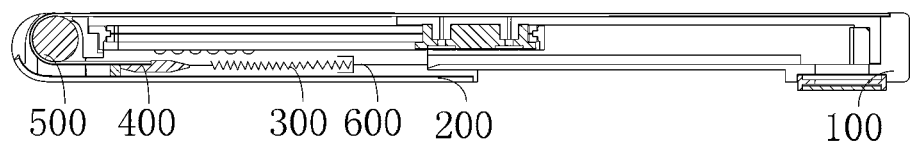
FIG. 8 is another partial cross-sectional view of an electronic device according to an embodiment of the present disclosure.
Figure 9:
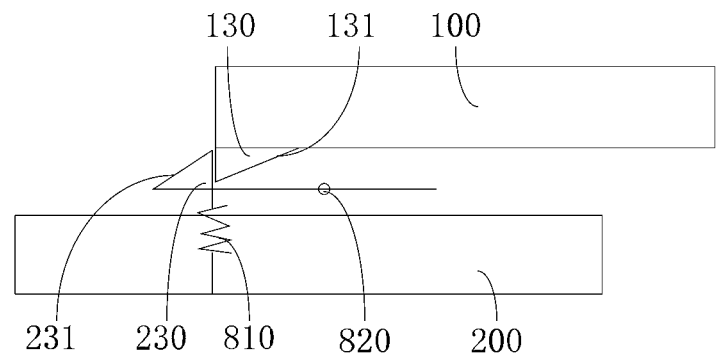
FIG. 9 is a partial schematic structural diagram of an electronic device according to an embodiment of the present disclosure.
Figure 10:
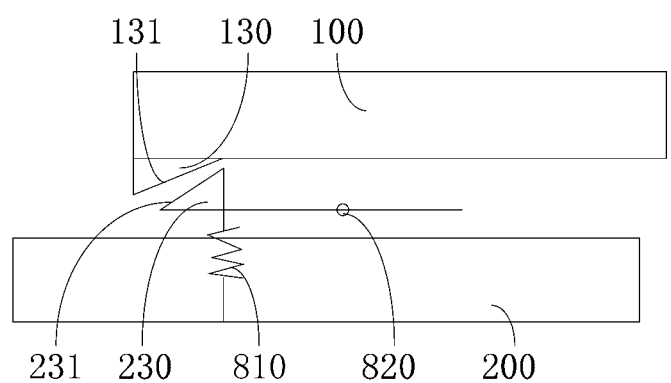
FIG. 10 is a partial schematic structural diagram of an electronic device in another state according to an embodiment of the present disclosure.

In an optional embodiment, the first housing 100 may be provided with a limiting sliding block 120, and the second housing 200 may be provided with a limiting groove 220, referring to FIG. 6. In this case, the first housing 100 does not need to be thick, so that the first housing 100 can slide more easily, thereby making the first housing 100 more flexible. Certainly, the first housing 100 is provided with the limiting sliding block 120, which can prevent from being stuck.

Further, a quantity of limiting grooves 220 and a quantity of limiting sliding blocks 120 may be two. The two limiting grooves 220 may be parallel to each other, and each limiting groove 220 may be in sliding fit with one limiting sliding block 120. Still refer to FIG. 6, in this case, the limiting fit between the two limiting grooves 220 and the two limiting sliding blocks 120 can play a better guiding function, so that the first housing 100 can slide better relative to the second housing 200. In addition, this method can also better prevent at least part of the first housing 100 from separating from the second housing 200, thereby better improving sliding stability of the second housing 200.

In this embodiment disclosed in the present disclosure, optionally; the first housing 100 may be provided with a first mounting portion 130, and the second housing 200 may be provided with a second mounting portion 230. In a case that the first housing 100 and the second housing 200 slide apart, to be specific, in a case that more display area of the flexible display screen 400 can be exposed to the external environment, the first mounting portion 130 may be in limiting fit with the second mounting portion 230, so that the flexible display screen 400 can be prevented from retracting under the pulling force of the first elastic piece 300, and the flexible display screen 400 can be maintained in the above state, thereby improving user experience. It should be noted that in a case that the flexible display screen 400 is expanded to an maximum expanded area, the first mounting portion 130 is in limiting fit with the second mounting portion 230, or in a case that the flexible display screen 400 has a certain expanded length but does not reach the maximum expanded area, the first mounting portion 130 is in limiting fit with the second mounting portion 230.

Optionally, when the first housing 100 slides apart from the second housing 200, the first mounting portion 130 may be disposed close to the second housing 200, and the second mounting portion 230 may be disposed close to the first housing 100. In this case, when the first mounting portion 130 is in limiting fit with the second mounting portion 230, the first housing 100 can slide apart to a larger distance relative to the second housing 200, so that the flexible display screen 400 can have a larger exposed display area, thereby enabling the electronic device to have a better visual effect.

In an optional embodiment, the electronic device may further include a key 700. The first housing 100 or the second housing 200 may be provided with a key hole. The key 700 is movably disposed in the key hole. One end of the key 700 can protrude from an outer surface of the first housing or the second housing 200 so that a user can press the key 700, and the other end of the key 700 may be connected to the first mounting portion 130 or the second mounting portion 230 through transmission. In this case, when the user presses the key 700, the key 700 can push the first mounting portion 130 or the second mounting portion 230 to move, so that the first mounting portion 130 or the second mounting portion 230 deviates from an original position, the second mounting portion 230 can be driven to separate from the first mounting portion 130, and the first housing 100 can move in the direction close to the second housing 200. This method can help the user operate better, and also make it easier to separate the second mounting portion 230 from the first mounting portion 130.

Certainly, in this case, the first housing 100 may be provided with the key hole, and the key 700 may be movably disposed in the key hole. One end of the key 700 can protrude from the outer surface of the first housing 100 so that the user can press the key 700, and the other end of the key 700 may be connected to the first mounting part 130 through transmission. For example, the key 700 may be connected to the first mounting portion 130 through a connecting piece. When the user presses the key 700, the key 700 can push the first mounting portion 130 to move, so that the first mounting portion 130 deviates from the original position, the second mounting portion 230 can be driven to separate from the first mounting portion 130, and the first housing 100 can move in the direction close to the second housing 200.

Alternatively, the second housing 200 may be provided with the key hole, and the key 700 may be movably disposed in the key hole. One end of the key 700 can protrude from an outer surface of the second housing 200 so that the user can press the key 700, and the other end of the key 700 may be connected to the second mounting portion 230. When the user presses the key 700, the key 700 can push the second mounting portion 230 to move, so that the second mounting portion 230 can deviate from the original position, the second mounting portion 230 can be driven to separate from the first mounting portion 130, and the first housing 100 can move in the direction close to the second housing 200. This is not limited this embodiment of the present disclosure.

Further, the electronic device may further include a second elastic piece 810 and a hinged shaft 820. The hinged shaft 820 may be disposed in the second housing 200. The second mounting portion 230 may be connected to the second housing 200 through the second elastic piece 810. The second mounting portion 230 may be hinged to the hinged shaft 820. The key 700 can drive the second mounting portion 230 to rotate around the hinged shaft 820, and drive the second elastic piece 810 to compress, so that the second mounting portion 230 can be separated from the first mounting portion 130. This method enables the key 700 to push the second mounting portion 230 to move more easily. In addition, when the second mounting portion 230 is separated from the first mounting portion 130, the second elastic piece 810 can also make the second mounting portion 230 return to the original position, so that the second mounting portion 230 can be in mounting fit with the first mounting portion 130 again, thereby improving flexibility between the second mounting portion 230 and the first mounting portion 130. Certainly, the second elastic piece 810 may be a spiral spring. The second elastic piece 810 may also be other elastic components, which is not limited in this embodiment of the present disclosure.

In this embodiment of the present disclosure, the first mounting portion 130 can have a first guide slope 131, and the second mounting portion 230 can have a second guide slope 231. The first guide slope 131 may be disposed opposite the second guide slope 231, and the first guide slope 131 may be in sliding fit with the second guide slope 231, referring to FIG. 9) and FIG. 10. In this case, during a process in which the first housing 100 slides in a direction away from the second housing 200, when the first guide slope 131 slides relative to the second guide slope 231, the first mounting portion 130 can push the second mounting portion 230 to swing in a direction toward the second elastic piece 810 through the first guide slope 131 to drive the second elastic piece 810 to compress; and when the first guide slope 131 slides apart from the second guide slope 231, the second elastic piece 810 applies an elastic force to the second mounting portion 230 to make the second mounting portion 230 return to the original position, still referring to FIG. 9, so that the second mounting portion 230 is in mounting fit with the first mounting portion 130. This method enables the second mounting portion 230 to more easily be in mounting fit with the first mounting portion 130, thereby better preventing the flexible display screen 400 from retracting under the pulling force of the first elastic piece 300, so that the flexible display screen 400 can be maintained in the expanded state, and the user can have better use experience.

In another optional embodiment, the electronic device may further include an ejector pin. The first housing 100 may be provided with an ejector pin hole. During use, the ejector pin can extend into the second housing 200 through the ejector hole. The ejector pin can push the second mounting portion 230 to move, so that the second mounting portion 230 deviates from the original position, thereby driving the second mounting portion 230 to separate from the first mounting portion 130. This method enables the second mounting portion 230 to more easily be separated from the first mounting portion 130.

In this embodiment of the present disclosure, the first housing 100 may include a first middle frame 140, and the second housing 200 includes a second middle frame 240. The first housing 100 and the second housing 200 may be slidably connected to the second middle frame 240 through the first middle frame 140. In a case that the first housing 100 and the second housing 200 are in a connected state, the first middle frame 140 is coplanar with the second middle frame 240, as shown in FIG. 1. This method enables the structure of the electronic device to be more compact. In addition, appearance performance of the electronic device can be improved.

The electronic device in the embodiments of the present disclosure may be a smart phone, a tablet computer, an e-book reader, a wearable device (for example, a smart watch), a video game console, and the like. The embodiments of the present disclosure do not limit the specific type of the electronic device.

The embodiments of the present disclosure focus on describing differences between the embodiments, and different optimization features of the embodiments may be combined to form better embodiments provided that they are not contradictory. Considering brevity, details are not described herein again.

The foregoing descriptions are merely embodiments of the present disclosure, but are not intended to limit the present disclosure. Various changes and modifications may be made to the present disclosure by those skilled in the art. Any modifications, equivalent substitutions, improvements, and the like made within the spirit and principle of the present disclosure should be included within the scope of the claims of the present disclosure.

What is claimed is:

1. An electronic device, comprising: a first housing (100); a second housing (200), wherein the second housing (200) is slidably connected to the first housing (100); a first elastic piece (300), wherein a first end of the first elastic piece (300) is connected to the second housing (200); a flexible display screen (400), wherein a first end of the flexible display screen (400) is connected to a second end of the first elastic piece (300), a second end of the flexible display screen (400) is connected to the first housing (100), and the first housing (100) is capable of driving the second end of the flexible display screen (400) to move; and a rotating shaft (500), wherein the rotating shaft (500) is rotatably disposed in the second housing (200), and the flexible display screen (400) is in rolling contact with the rotating shaft (500); wherein in a case that the first housing (100) slides in a direction away from the second housing (200), the first housing (100) drives the flexible display screen (400) to move around the rotating shaft (500), and a part of the flexible display screen (400) moves from a first side to a second side; and in a case that the first housing (100) slides in a direction close to the second housing (200), the first elastic piece (300) drives the flexible display screen (400) to move around the rotating shaft (500), and the part of the flexible display screen (400) moves from the second side to the first side, wherein the first side and the second side are two sides of the rotating shaft (500) that are opposite each other; and the first housing (100) is provided with a first mounting portion (130), and the second housing (200) is provided with a second mounting portion (230), wherein in a case that the first housing (100) detaches from the second housing (200), the first mounting portion (130) is in limiting fit with the second mounting portion (230);

and the electronic device further comprises a second elastic piece (810) and a hinged shaft (820), wherein the hinged shaft (820) is disposed in the second housing (200), the second mounting portion (230) is connected to the second housing (200) through the second elastic piece (810), the second mounting portion (230) is hinged to the hinged shaft (820), wherein the key (700) is capable of driving the second mounting portion (230) to rotate around the hinged shaft (820), and driving the second elastic piece (810) to compress, so that the second mounting portion (230) separates from the first mounting portion (130).

2. The electronic device according to claim 1, wherein the electronic device further comprises a damper (600), wherein the first end of the first elastic piece (300) is connected to the second housing (200) through the damper (600).

3. The electronic device according to claim 1, wherein an edge of the first housing (100) is provided with a first connecting portion (110), an edge of the second housing (200) is provided with a second connecting portion (210), at least a part of the second housing (200) fits around the first housing (100), and the first connecting portion (110) is slidably connected to the second connecting portion (210).

4. The electronic device according to claim 3, wherein one of the first connecting portion (110) and the second connecting portion (210) is a sliding groove, and the other is a protrusion, wherein the sliding groove is in sliding fit with the protrusion.

5. The electronic device according to claim 1, wherein one of the first housing (100) and the second housing (200) is provided with a limiting groove (220), and the other is provided with a limiting sliding block (120), wherein the limiting groove (220) is in sliding fit with the limiting sliding block (120), and an end portion of the limiting groove (220) is in limiting fit with the limiting sliding block (120).

6. The electronic device according to claim 5, wherein there are two limiting grooves (220) and two limiting sliding blocks (120), wherein the two limiting grooves (220) are parallel to each other, and each limiting groove (220) is in sliding fit with one limiting sliding block (120).

7. The electronic device according to claim 1, wherein the first mounting portion (130)) is provided with a first guide slope (131), the second mounting portion (230) is provided with a second guide slope (231), the first guide slope (131) is disposed opposite the second guide slope (231), and the first guide slope (131) is in sliding fit with the second guide slope (231).

8. The electronic device according to claim 1, wherein the first housing (100) comprises a first middle frame (140), the second housing (200) comprises a second middle frame (240), and the first housing (100) and the second housing (200) is slidably connected to the second middle frame (240) through the first middle frame (140), and in a case that the first housing (100) and the second housing (200) are in a connected state, the first middle frame (140) is coplanar with the second middle frame (240).

* * * * *